US012069807B2

(12) United States Patent
Graham

(10) Patent No.: US 12,069,807 B2
(45) Date of Patent: Aug. 20, 2024

(54) REINFORCEMENT STRUCTURES FOR SURFACE MOUNT PACKAGING COMPONENTS

(71) Applicant: Simmonds Precision Products, Inc., Vergennes, VT (US)

(72) Inventor: Jason Graham, Prior Lake, MN (US)

(73) Assignee: Simmonds Precision Products, Inc., Vergennes, VT (US)

(*) Notice: Subject to any disclaimer, the term of this patent is extended or adjusted under 35 U.S.C. 154(b) by 59 days.

(21) Appl. No.: 17/705,351

(22) Filed: Mar. 27, 2022

(65) Prior Publication Data

US 2023/0309232 A1 Sep. 28, 2023

(51) Int. Cl.
*H05K 1/18* (2006.01)
*H01L 23/00* (2006.01)
*H01L 23/498* (2006.01)

(52) U.S. Cl.
CPC ........ *H05K 1/181* (2013.01); *H01L 23/49816* (2013.01); *H01L 23/562* (2013.01); *H05K 2201/10734* (2013.01)

(58) Field of Classification Search
CPC .......... H05K 1/181; H05K 2201/10734; H01L 23/49816; H01L 23/562
See application file for complete search history.

(56) References Cited

U.S. PATENT DOCUMENTS

| 10,483,217 B2 | 11/2019 | Haba et al. | |
|---|---|---|---|
| 10,636,749 B2 | 4/2020 | Leong et al. | |
| 2009/0114436 A1* | 5/2009 | Chen | H05K 3/3452 174/263 |
| 2009/0268423 A1* | 10/2009 | Sakurai | H05K 1/144 361/803 |
| 2014/0376202 A1* | 12/2014 | Shibutani | H01L 23/49811 361/767 |
| 2017/0135203 A1* | 5/2017 | Shen | H01L 23/562 |
| 2018/0040572 A1* | 2/2018 | Haba | H01L 23/562 |
| 2019/0343017 A1* | 11/2019 | Eid | H01L 24/17 |
| 2020/0344881 A1* | 10/2020 | Tonaru | H05K 3/303 |

* cited by examiner

*Primary Examiner* — Timothy J Thompson
*Assistant Examiner* — Harmandeep Singh
(74) *Attorney, Agent, or Firm* — Schwegman Lundberg & Woessner, P.A.

(57) ABSTRACT

In accordance with at least one aspect of this disclosure, a system includes a reinforcement structure configured to seat in an air gap between one or more solder balls of a ball grid array of a surface mount packaging component. The reinforcement structure is configured and reduce bending of the circuit board during acceleration of the circuit board.

9 Claims, 5 Drawing Sheets

REINFORCEMENT STRUCTURES FOR SURFACE MOUNT PACKAGING COMPONENTS

TECHNICAL FIELD

The present disclosure relates to support structures, and more particularly to support structures for surface mount packaging components on circuit boards (e.g., ball grid arrays)

BACKGROUND

Large ball grid array components are used in certain moving platforms subject to high acceleration, such as in long range precision guided munitions. Through this acceleration, the ball grid array and board are subjected to large forces and in severe enough situations can potentially bend and may crack, resulting in failed electronics, open circuits, or short circuits.

There remains a need in the art, e.g., in the aerospace industry, for improved support structures for ball grid arrays and like components subject to high acceleration. This disclosure provides a solution for this need.

SUMMARY

In accordance with at least one aspect of this disclosure, a system includes a reinforcement structure configured to seat in an air gap between one or more solder balls of a ball grid array of a surface mount packaging component. The reinforcement structure is configured to reduce bending of the circuit board and electronics component during acceleration of the circuit board.

In embodiments, the reinforcement structure can be configured to surround each of the solder balls individually. Additionally or alternatively, the reinforcement structure can be configured to surround groups of the solder balls. In certain embodiments, the reinforcement structure can include a grid pattern, the grid including a plurality of grid modules. Each grid module can include an opening configured to enclose each solder ball. In embodiments, the number of openings can be equal to a number of solder balls in the ball grid array.

In embodiments, each grid module of the plurality of grid modules can directly contact its neighboring grid modules in the grid. In certain embodiments, the plurality of grid modules can include at least one of a circle and/or a rectangle. In certain embodiments, each grid module of the plurality of grid modules can be connected to its neighboring grid modules via a cross member. In certain such embodiments, the plurality of grid modules can include at least one of a circle and/or a rectangle.

In certain embodiments, the number of openings can be greater than the number of solder balls in the ball grid array. In certain embodiments, the plurality of grid modules can include a plurality of hexagons such that the grid pattern includes a honeycomb pattern. In certain embodiments, the reinforcement structure does not surround each solder ball of the ball grid array individually.

In embodiments, the reinforcement structure can be formed from one or more of metal, plastic, ceramic, and/or silicon, but not limited to metal, plastic, ceramic, and/or silicon. In certain embodiments, the reinforcement structure can be formed from a material that is thermally or electrically insulative or conductive. In certain embodiments, the reinforcement structure can include one or more of a coating or finish applied to the structure to make it conductive or insulative (e.g., to prevent shorts).

In embodiments, a height of the reinforcement structure can be configured to limit an amount of collapse of the solder balls during reflow. In certain embodiments, the reinforcement structure can be formed using one or more of micro-machining, etching, laser cutting, laser sintering, wire electrical discharge machining (EDM), and/or additive manufacturing.

In certain embodiments, the system can include one or more support beams configured to seat in the air gap between the one or more solder balls where the reinforcement structure is not seated to provide an airflow path through and under the ball grid array during reflow. In embodiments, the one or more support beams can form an "H" shape or include voids therein to allow air to pass through between the reinforcement structure and the surface mount component. Additionally or alternatively, the voids can be configured for filling with underfill material after mounting the reinforcement structure with reflow.

In embodiments, an electronics component can be attached to a first side of the circuit board via the surface mount packaging component and the ball grid array can be operatively connected to a second side of the surface mount packaging component to mount the packaging component to the circuit board. The electronics component can be in communication with the reinforcement structure through one or more vias in the surface mount packaging component.

In certain embodiments, the one or more vias can include thermal vias configured to conduct thermal energy from the electronics component to the second side of the surface mount packaging component and through the reinforcement structure to dissipate the thermal energy through the circuit board. In certain such embodiments, the reinforcement structure can be soldered to the second side of the surface mount component and/or the circuit board.

In certain embodiments, the one or more vias can include electrical vias configured to electrically connect to ground, where the reinforcement structure is electrically connected to a ground plane of the circuit board to shield the solder balls of the ball grid array from signal cross talk. In certain embodiments, the reinforcement structure can be adhered to the second side of the surface mount packaging component.

In certain embodiments, a potting material can be filled within the ball grid array and the within the openings of the reinforcement structure configured to provide additional structural support and/or shock absorption and/or stress dispersion to the circuit board and electronics component during acceleration of the circuit board. In certain embodiments, the system can be included in a moving platform subject to high acceleration. In embodiments, the moving platform can include a guided munition.

These and other features of the embodiments of the subject disclosure will become more readily apparent to those skilled in the art from the following detailed description taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION

Figure 1:
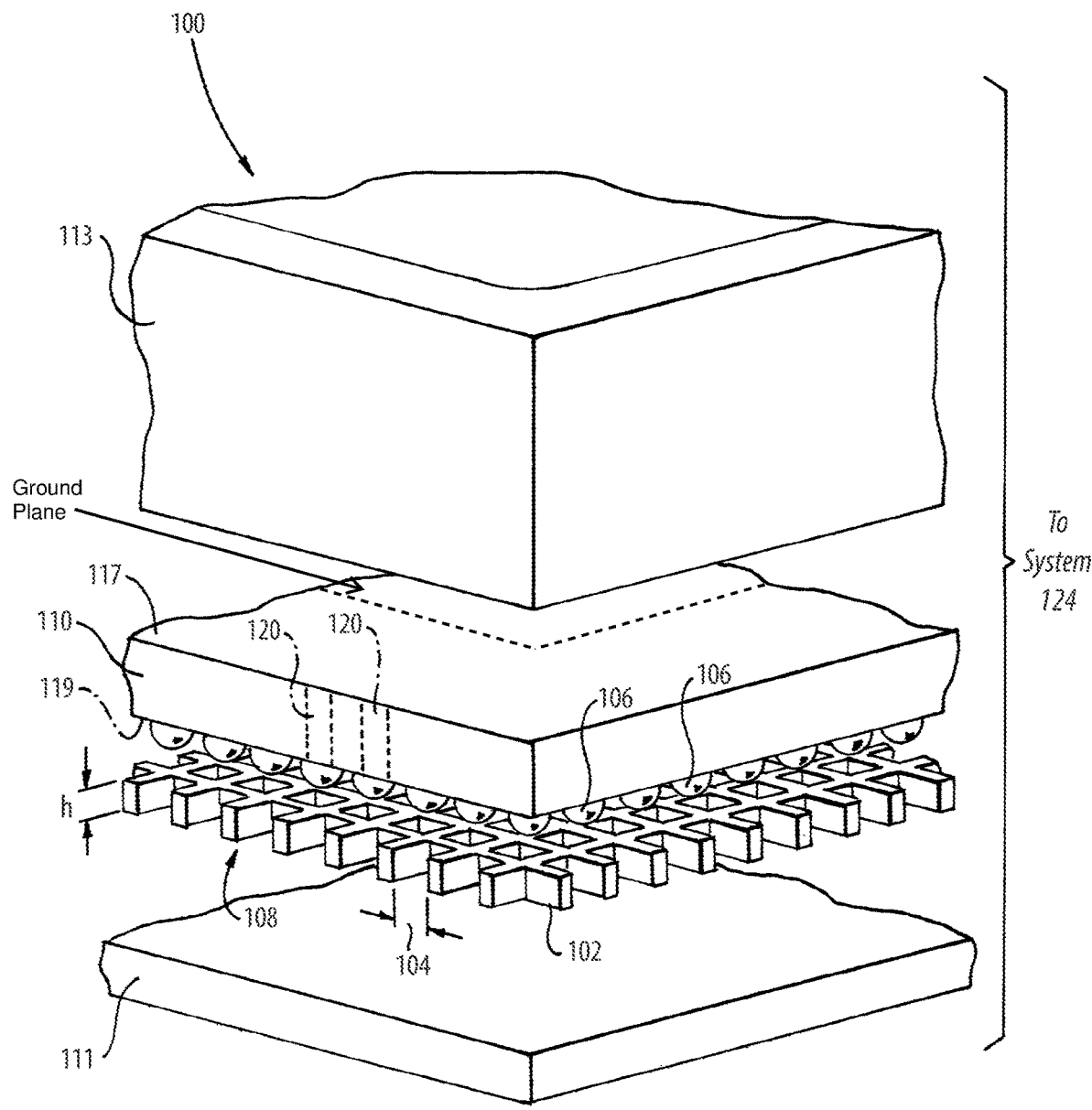
FIG. 1 is a side perspective view of a system in accordance with this disclosure, showing a surface mount component having a ball grid array and an embodiment of a reinforcement structure.

Reference will now be made to the drawings wherein like reference numerals identify similar structural features or aspects of the subject disclosure. For purposes of explanation and illustration, and not limitation, an illustrative view of an embodiment of a system in accordance with the disclosure is shown in FIG. 1 and is designated generally by reference character 100. Other embodiments and/or aspects of this disclosure are shown in FIGS. 2-9.

In accordance with at least one aspect of this disclosure, a system 100 includes a reinforcement structure 102 configured to seat in an air gap 104 between one or more solder balls 106 of a ball grid array 108 of a surface mount packaging component 110. The reinforcement structure 102 is configured to reduce bending of a circuit board 111 during acceleration of the circuit board 111.

Figure 2:
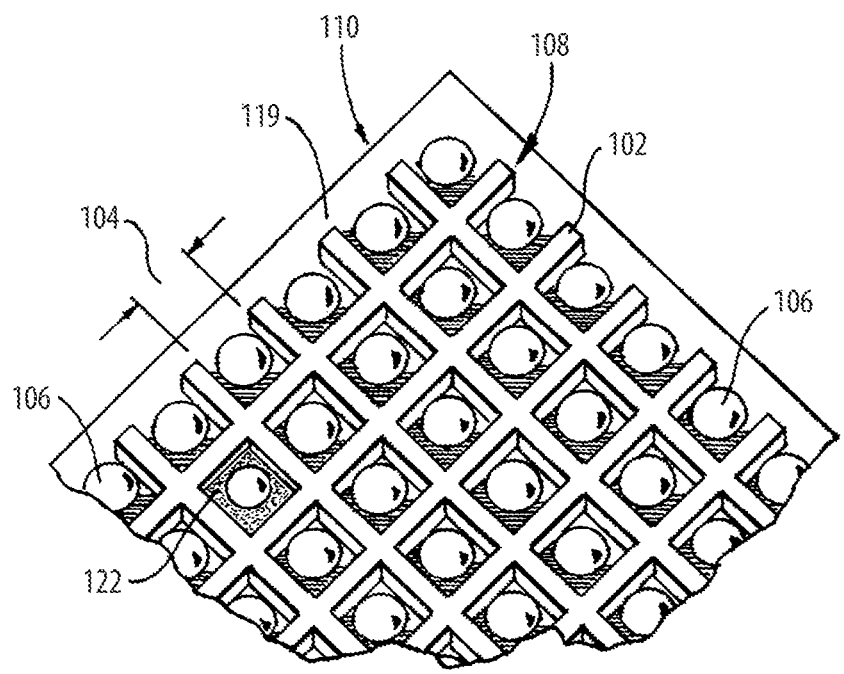
FIG. 2 is a bottom up view of the system of FIG. 1, showing the reinforcement structure of FIG. 1 within the ball grid array.
Figure 3:
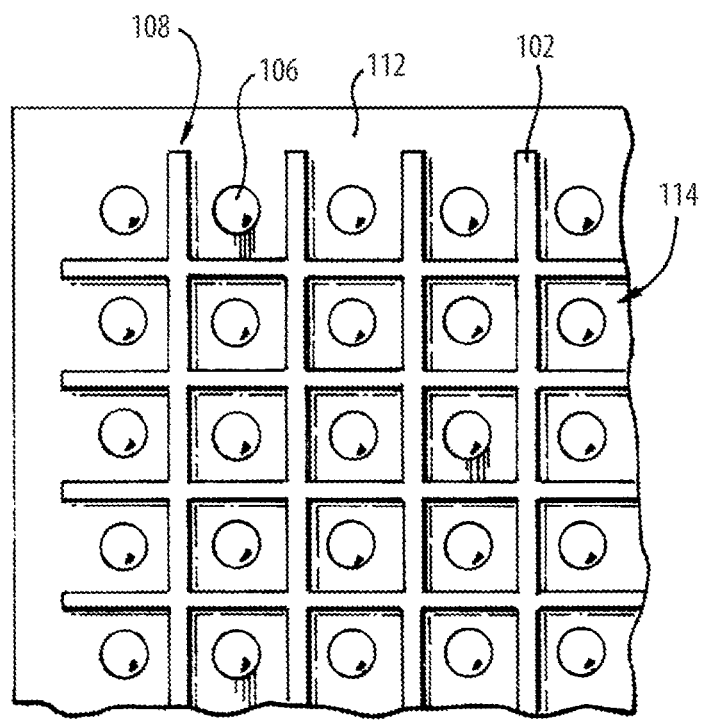
FIG. 3 is a schematic plan view of the reinforcement structure of FIGS. 1 and 2.

In embodiments, the reinforcement structure 102 can be configured to surround each of the solder balls 106 individually. In certain embodiments, such as shown in FIGS. 1-3, the reinforcement structure 102 can include a grid pattern. The grid can include openings 112 defined by a grid modules 114. Each module 114 can include a distinct shape (e.g., a rectangle as shown in FIGS. 1-3). It is contemplated the modules 114 can all have the same shape, or may include different shapes within the same reinforcement structure 102. As shown, a number of openings 112, as well as, the number of modules 114, in the grid can be equal to a number of solder balls 106 in the ball grid array 108. In certain embodiments, such as in FIG. 3, each module 114 of the grid 102 can directly contact its neighboring modules 114.

In embodiments, the reinforcement structure 102 can be formed from one or more materials, including but not limited to, metal, plastic, ceramic, and/or silicon material. In certain embodiments, the reinforcement structure 102 can be formed from a material that is thermally and/or electrically insulative or conductive. In certain embodiments, the reinforcement structure 102 can include one or more of a coating and/or a finish applied to the reinforcement structure 102 to make it conductive or insulative (e.g., to prevent shorts).

In embodiments, a height h of the reinforcement structure 102 can be configured to limit an amount of collapse of the solder balls 106 during reflow. This could ensure repeatable component height above the board. In certain embodiments, the reinforcement structure 102 can be formed using one or more of micro-machining, etching, laser cutting, laser sintering, wire electrical discharge machining (EDM), and/or additive manufacturing.

In embodiments, the electronics component 113 can be attached to a first side 117 of the circuit board 111 via the surface mount packaging component 110 and the ball grid array 106 can be operatively connected to a second side 119 of the surface mount packaging component 110 to mount the electronics component 113 to the circuit board 111. The electronics component 113 can be in communication with the reinforcement structure 102 through one or more vias 120 in the surface mount packaging component 110.

In certain embodiments, the one or more vias 120 can include thermal vias configured to conduct thermal energy from the electronics component 113 to the second side 119 of the surface mount packaging component 110 and through the reinforcement structure 102 to dissipate the thermal energy through the circuit board 111. In certain such embodiments, the reinforcement structure 102 can be soldered to the second side 119 of the surface mount component 110 and/or the circuit board 111.

In certain embodiments, the one or more vias 120 can include electrical vias configured to electrically connect to ground, where the reinforcement structure 102 is electrically connected to a ground plane of the circuit board 111 to shield the solder balls 106 of the ball grid array 108 from signal cross talk. In certain embodiments, the reinforcement structure 102 can be adhered to the second side 119 of the surface mount packaging component 110 in a manner different than soldering.

In certain embodiments, a potting material 122 (e.g., epoxy) can be filled within the ball grid array 108 and the within the reinforcement structure 102 configured to provide additional structural support and/or shock absorption and/or stress dispersion to the circuit board 111 and electronics component 113 during acceleration of the circuit board 111. In certain embodiments, the system 100 can be included in a moving platform 124 subject to acceleration. In embodiments, the moving platform 124 can include a guided munition.

In certain embodiments, in FIGS. 4-9, the system can have the same or similar components as described in system 100. For brevity, the description of common elements that have been described above are not repeated with respect to FIGS. 4-9 where the reinforcement structure 102 is shown having different designs.

Figure 4:
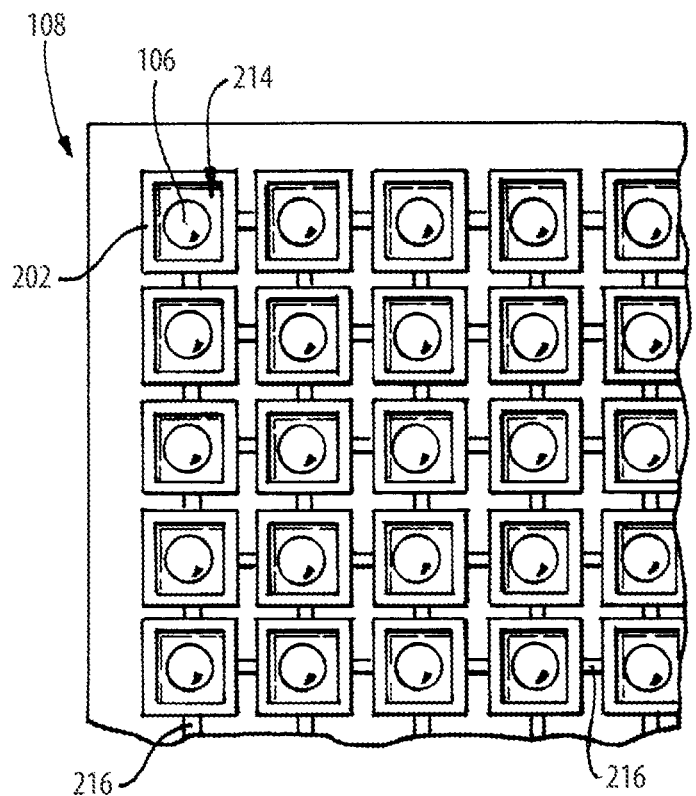
FIG. 4 is a schematic plan view of another embodiment of a reinforcement structure within the ball grid array.
Figure 5:
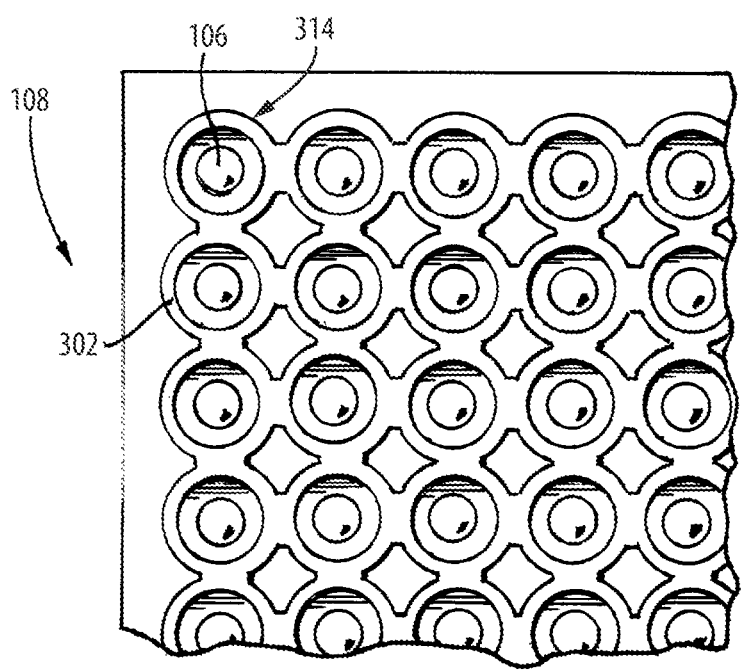
FIG. 5 is a schematic plan view of another embodiment of a reinforcement structure within the ball grid array.
Figure 6:
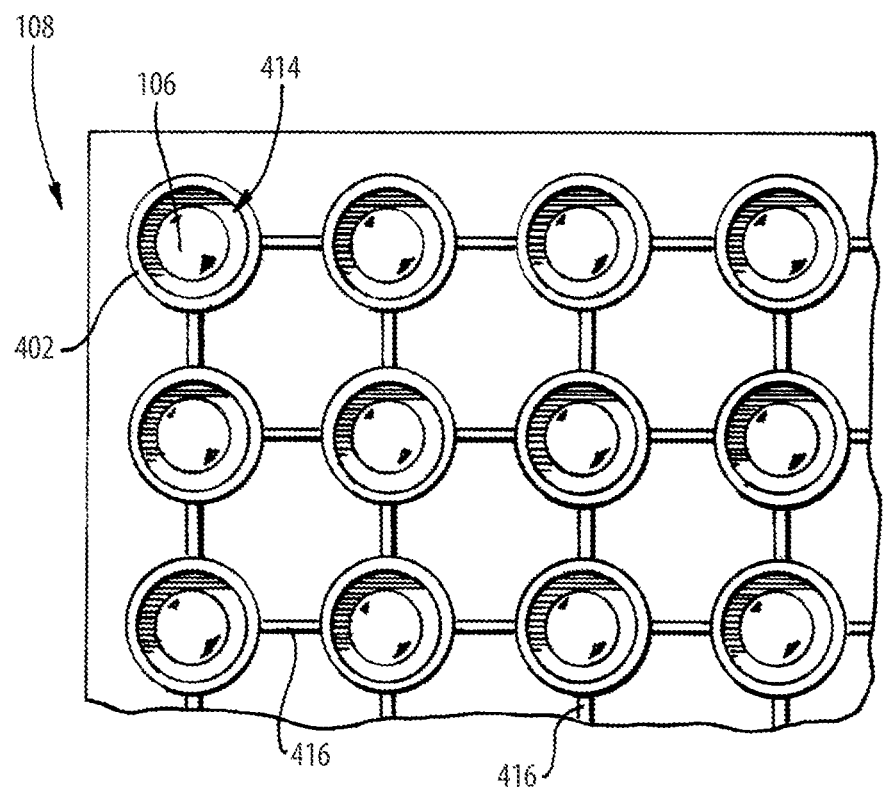
FIG. 6 is a schematic plan view of another embodiment of a reinforcement structure within the ball grid array.

In certain embodiments, such as in FIG. 4, in reinforcement structure 202, each module 214 of the grid 202 can include rectangles and can be connected to its neighboring modules 214 via a cross member 216. In certain embodiments, such as shown in FIG. 5, the reinforcement structure 302 can include a grid pattern where the modules 314 include circles, and each circle module 314 can directly contact its neighboring modules 314 in the grid 302. In certain embodiments, such as shown in FIG. 6, the grid pattern can include a grid 402 of circle modules 414, where each module 414 can be connected to its neighboring module 414 in the grid via a cross member 416.

Figure 7:
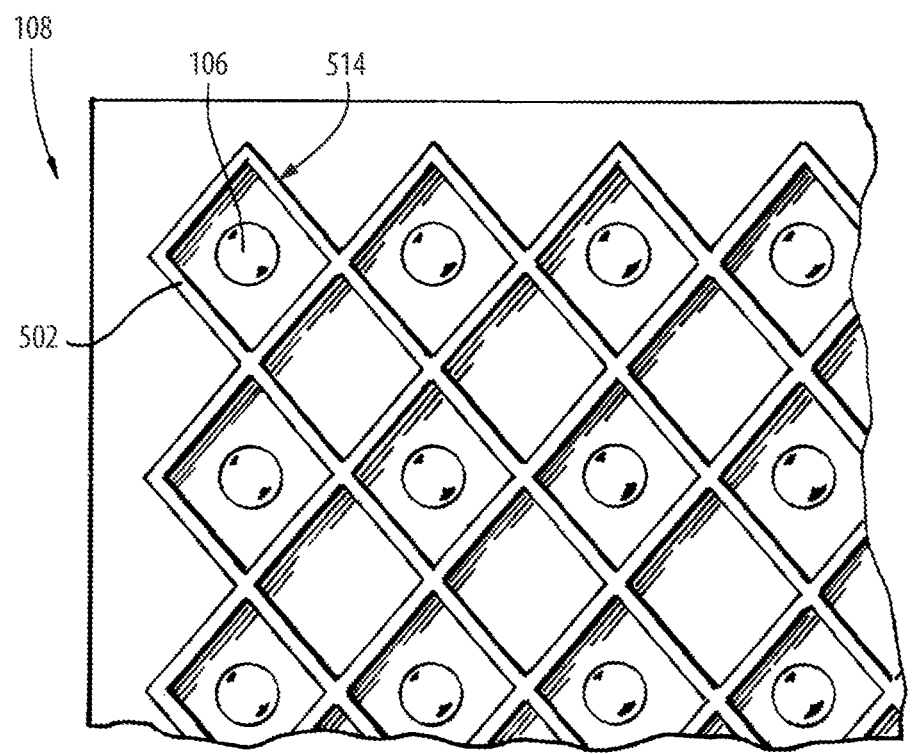
FIG. 7 is a schematic plan view of another embodiment of a reinforcement structure within the ball grid array.
Figure 8:
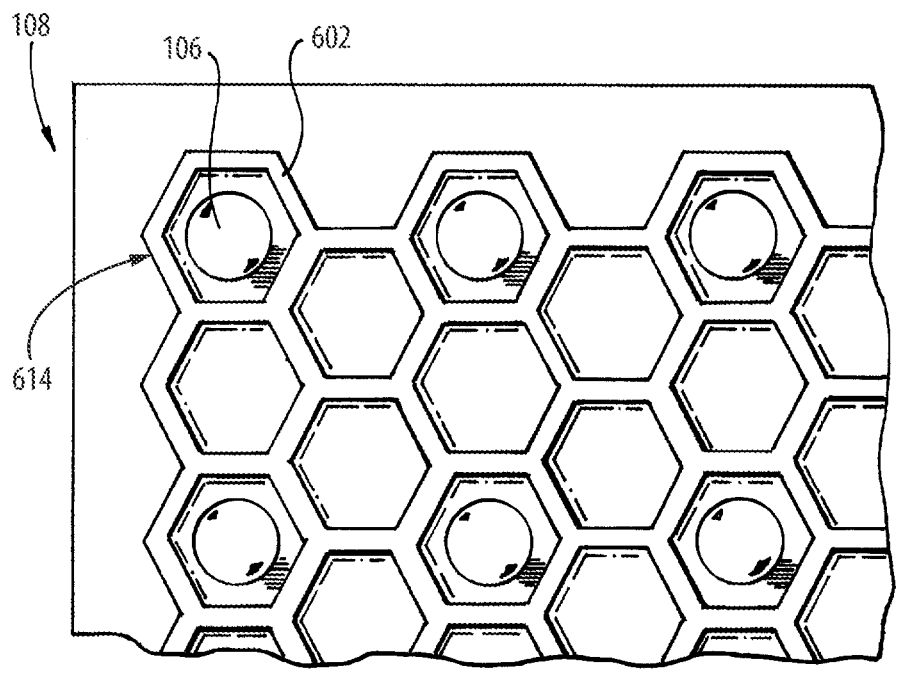
FIG. 8 is a schematic plan view of another embodiment of a reinforcement structure within the ball grid array.

In certain embodiments, such as shown in FIGS. 7 and 8, the reinforcement structure 502, 602 includes a grid pattern, wherein a number of openings 512, 612 and modules 514, 614 in the grid is greater than a number of solder balls 106 in the ball grid array 108. In certain embodiments, as shown in FIG. 8, the grid pattern 602 can include a honeycomb pattern.

Figure 9:
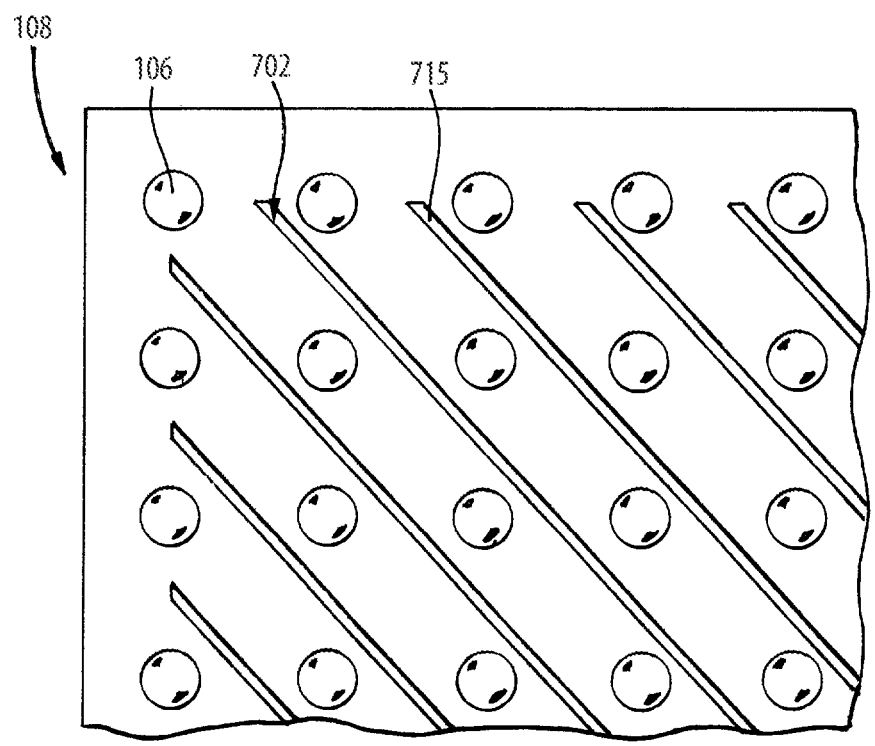
FIG. 9 is a schematic plan view of another embodiment of a reinforcement structure within the ball grid array.

In certain embodiments, such as shown in FIG. 9, the reinforcement structure 702 does not surround each solder ball 106 of the ball grid array 108 individually. Here, the reinforcement structure 702 can include support beams 715 configured to seat in the air gap 104 between the solder balls 106 where the reinforcement structure 702 to provide an airflow path through and under the ball grid array 108 during reflow. In embodiments, the support beams 715 can form an "H" shape or include voids therein to allow air to pass through between the reinforcement structure 702 and the surface mount component 110 during reflow. In certain embodiments, the voids can be configured for filling with underfill material after mounting the reinforcement structure 702 with reflow.

In certain applications, long range precision guided munitions may require increasing launch acceleration to reach their targets at extended ranges. Those high accelerations apply large forces on guidance electronics and hardware. In certain applications, the munition may also require small SWAP-C subsystems due to an increasing demand for small aerodynamic profiled airframe bodies, to maintain the speed necessary to traverse the range. Such designs may lead to higher density electronics and the need for ball grid array (BGA) electronics components. In small SWAP-C circuit boards, for example, the BGA could potentially take up most of the board space, and with high acceleration loads, the circuit board and BGA component may be at increased risk for bending and/or cracking (and perhaps subsequent failure). Bending may be exacerbated if the electronics and BGA components are large and/or centrally located on a board under axial acceleration. Embodiments of the reinforcement structure as shown and described herein provide a means of mitigating these risks by providing support to the board to prevent bending under such high accelerations.

Embodiments include a support structure (e.g., any of reinforcement structures as described above) to be placed under a ball grid array (BGA) component in and around solder balls. The reinforcement structure can provide increased strength and stiffness to a circuit board and electronics component, with little added mass, providing greater support than that of underfill or potting alone. In embodiments, the reinforcement structure can have a consistent assembled z-height. In certain embodiments, the reinforcement structure could also be used as a heatsink for heat generating electronics components. In certain embodiments, the reinforcement structure can be configured and adapted to improve cross-talk between solder ball signals.

As shown, the reinforcement structure can be seated under the BGA component in the same air gap that the solder balls reside, but interwoven around those solder balls. Due to the high acceleration, the circuit board can flex at a greater rate than the BGA component, which can lead to cracking in the BGA component or breakage of the solder bonds, resulting in open circuits or shorts. Additionally, under the load of the BGA component on the solder balls, the balls are relatively soft and can further compress, leading to increased BGA component damage. By including the reinforcement structure under the BGA component, the reinforcement structure can increase the board and board/BGA interface stiffness, while adding very little mass, and result in less bending during acceleration. As shown in FIGS. 1-3, the reinforcement structure can be a grid style patterned support under the BGA component.

The reinforcement component could add additional strength to the BGA component which may be about 4-10× greater than underfill material (e.g., epoxy) alone. In embodiments, the reinforcement structure could include a tensile strength greater than about 20 ksi, or greater than about 80 ksi, greater than about 200 ksi, or within the range of about 20 ksi to 200 ksi. The reinforcement structure can also provide additional strength over the solder of the ball grid component alone. For example, a ball grid component with solder comprising Sn63/Pb37 may have a tensile strength of 7.8 ksi, while solder comprising aluminum 7068-T6 may have a tensile strength of 99 ksi. While adding the underfill material may add additional rigidity to the ball grid components, board flex under high acceleration may still be a concern. In certain embodiments, the reinforcement structure can be made of aluminum (e.g., aluminum 7068-T6) which can have a tensile strength of about 99 ksi. Thus, in certain such embodiments, the reinforcement structure could be greater than 10 times stronger than solder alone and greater than four times stronger than underfill epoxy with traditional solder. The point here is that the support structure carries the acceleration load rather than these other weak materials.

The reinforcement structure can be formed from any number of materials depending on application or desired ancillary functions of the reinforcement structure. For example, the material for the reinforcement structure could be chosen based on strength, thermal expansion, thermal conductivity, and/or electrical properties, such as but not limited to: metals, plastics, ceramics, silicon, and the like. In certain embodiments, the material could be either thermally or electrically insulative or conductive, or coatings or finishes may be applied to conductive materials to make them insulative.

The reinforcement structure can be a z height limiter and used as a z height standoff to limit the amount of collapse of the solder balls during reflow. This could ensure repeatable component height above the board. In embodiments, the reinforcement structure could be used with or without copper core solder balls, or a variety of solder ball materials could be used, for example, including but not limited to: bismuth, leaded and lead-free.

The reinforcement structure can take on any number of structural support shapes/patterns such as shown in, but not limited to, FIG. 3-9. The shapes/patterns can include any one or more of grids, honeycomb, cylinders, aerodynamic structures, and the like are contemplated herein. In embodiments, the reinforcement structure may cover all or a portion of the BGA component but in certain embodiments, the reinforcement structure could extend past the boundaries of the BGA component if needed or desired for a given application.

Embodiments of the reinforcement structure could be developed to improve installation and potting processes. In certain embodiments, the reinforcement structure could also be envisioned to have specific shapes to provide spring-like characteristics (e.g., coils or linear growing shapes configured for movement) where the compression force scales with distance compressed. In embodiments the reinforcement structure can include non-linear springs. In certain embodiments, the reinforcement structure shapes could be envisioned such as I-beams (e.g., not configured for movement and having a constant cross-section) to improve strength/stiffness, or other shapes could be made to change properties of the assembly.

The reinforcement structure can be manufactured using any one or more of micro-machining, etching, laser cutting or sintering, wire EDM, 3D printing, or other methods depending on application and required properties of the structure.

In certain embodiments, a thin adhesive layer could be applied to either or both sides of the support structure, or to the BGA component and/or circuit board to adhere the reinforcement structure to the BGA component and/or the board. In embodiments, the adhesive could be of structural strength or meant as a temporary bond until solder balls are reflowed. In certain embodiments, the reinforcement structure can be additively manufactured directly onto the circuit board or BGA component and/or the reinforcement structure could be formed as an integral part of the BGA component body.

In certain embodiments, the BGA component could be designed such that it has thermal vias that connect and conduct thermal energy from heat producing internal components to the bottom surface of the BGA component. The vias could be directly connected to the reinforcement structure to further spread the heat and/or conduct it into the circuit board. In certain such embodiments, the structure could be soldered to the BGA component and/or the circuit board. In embodiments, the circuit board may also include vias to transfer the heat from the reinforcement structure and spread it out for example through the board ground planes.

In certain embodiments, the vias inside the BGA component can be connected electrically to ground. In certain such embodiments, the structure could then be connected also to the ground plane in the circuit board which may help with cross-talk between signals in the BGA solder balls.

Adding the reinforcement structure as described herein may require additional considerations during typical hot air reflow processes, such as thermal ovens or hot air nozzles. However provided herein are a number of additional structures or methods to address these considerations. In certain embodiments, supports arranged in a path such as FIG. 9 can allow for airflow (perhaps from focused nozzles) to flow through and under the BGA component. In certain embodiments, additional structures that vertically look like an "H" or have a holes defined in a middle of the vertical structure to allow air to pass through, can be included. In certain embodiments, focused infrared reflow process may be used for reflowing solder as an alternative to the traditional hot air reflow, which would allow for enclosed support structures to be installed.

In certain embodiments, the reinforcement structure material could be lapped to provide a very consistent thickness. In certain embodiments, the reinforcement structure could be used with or without potting (adhesive such as epoxy), and in some applications, the reinforcement structure may be a sufficient replacement for potting altogether. In embodiments, if support structures include vertical features like an "H" or holes or other (e.g., as described above), potting material could be injected under the structure, after the BGA component and structure are attached to the board, to fill any gaps and increase strength. Doing so may also add some shock damping or stress dispersion. In certain applications, potting material may be added to the reinforcement structure and solder balls prior to attaching it to the board.

Those having ordinary skill in the art understand that any numerical values disclosed herein can be exact values or can be values within a range. Further, any terms of approximation (e.g., "about", "approximately", "around") used in this disclosure can mean the stated value within a range. For example, in certain embodiments, the range can be within (plus or minus) 20%, or within 10%, or within 5%, or within 2%, or within any other suitable percentage or number as appreciated by those having ordinary skill in the art (e.g., for known tolerance limits or error ranges).

The articles "a", "an", and "the" as used herein and in the appended claims are used herein to refer to one or to more than one (i.e., to at least one) of the grammatical object of the article unless the context clearly indicates otherwise. By way of example, "an element" means one element or more than one element.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of."

Any suitable combination(s) of any disclosed embodiments and/or any suitable portion(s) thereof are contemplated herein as appreciated by those having ordinary skill in the art in view of this disclosure.

The embodiments of the present disclosure, as described above and shown in the drawings, provide for improvement in the art to which they pertain. While the apparatus and methods of the subject disclosure have been shown and described, those skilled in the art will readily appreciate that changes and/or modifications may be made thereto without departing from the scope of the subject disclosure.

What is claimed is:

1. A system, comprising,
a reinforcement structure configured to seat in an air gap between one or more solder balls of a ball grid array of a surface mount packaging component, the reinforcement structure configured to reduce bending of a circuit board during acceleration of the circuit board, further comprising one or more support beams configured to seat in the air gap between the one or more solder balls to provide an airflow path through and under the ball grid array during reflow.

2. The system of claim 1, wherein the reinforcement structure does not surround each solder ball of the ball grid array individually.

3. The system of claim 1, wherein the reinforcement structure is formed from one or more of metal, plastic, ceramic, and/or silicon.

4. The system of claim 1, wherein a height of the reinforcement structure is configured to limit an amount of collapse of the solder balls during reflow.

5. The system of claim 1, further comprising,
an electronics component configured to attach to a first side of the circuit board via the surface mount packaging component; and
the ball grid array operatively connected to a second side of the surface mount packaging component configured to mount the packaging component to the circuit board,
wherein the electronics component is communication with the reinforcement structure through one or more vias in the surface mount packaging component.

6. The system of claim 5, wherein the one or more vias include thermal vias, wherein the one or more thermal vias are configured to conduct thermal energy from the electronics component to the second side of the surface mount packaging component and through the reinforcement structure to dissipate the thermal energy through the circuit board.

7. The system of claim 5, wherein the reinforcement structure is adhered to the second side of the surface mount packaging component.

8. The system of claim 5, further comprising a potting material filled within the ball grid array and openings of the reinforcement structure are configured to provide additional structural support and/or shock absorption and/or stress dispersion to the circuit board and the electronics component during acceleration of the circuit board.

9. The system of claim 5, wherein the system is included in a moving platform subject to acceleration.

* * * * *